United States Patent
Davis et al.

(10) Patent No.: US 10,471,937 B2
(45) Date of Patent: Nov. 12, 2019

(54) COMPRESSED AIR VEHICLE SCREEN CLEARING SYSTEM

(71) Applicants: Kenneth Davis, Greensboro, NC (US); Gregory Collins, Jr., Birmingham, AL (US)

(72) Inventors: Kenneth Davis, Greensboro, NC (US); Gregory Collins, Jr., Birmingham, AL (US)

( * ) Notice: Subject to any disclaimer, the term of this patent is extended or adjusted under 35 U.S.C. 154(b) by 0 days.

(21) Appl. No.: 14/068,591

(22) Filed: Oct. 31, 2013

(65) Prior Publication Data
US 2014/0117701 A1   May 1, 2014

Related U.S. Application Data

(60) Provisional application No. 61/720,739, filed on Oct. 31, 2012.

(51) Int. Cl.
| | |
|---|---|
| *B60S 1/54* | (2006.01) |
| *H01L 21/67* | (2006.01) |
| *A42B 3/26* | (2006.01) |
| *B60S 1/56* | (2006.01) |
| *B60S 1/58* | (2006.01) |
| *B60S 1/60* | (2006.01) |
| *B60R 1/06* | (2006.01) |
| *A47L 1/02* | (2006.01) |

(52) U.S. Cl.
CPC ............... *B60S 1/54* (2013.01); *A42B 3/26* (2013.01); *B60R 1/0602* (2013.01); *B60S 1/56* (2013.01); *B60S 1/58* (2013.01); *B60S 1/60* (2013.01); *H01L 21/67028* (2013.01)

(58) Field of Classification Search
CPC ........ B60S 1/0486; B60S 1/3801; B60S 1/60; B60S 1/34; B60S 1/64; B60S 1/54; H01L 21/67028; A47L 1/02
USPC ..... 15/250.001, 250.002, 250.003, 302, 313, 15/405; 134/21, 34, 37
See application file for complete search history.

(56) References Cited

U.S. PATENT DOCUMENTS

| | | | | |
|---|---|---|---|---|
| 5,486,139 | A | * | 1/1996 | Papp ................. B60S 1/54 15/313 |
| 5,546,630 | A | * | 8/1996 | Long ..................... 15/313 |
| 5,852,846 | A | * | 12/1998 | Gonzalez ............... 15/313 |
| 6,077,361 | A | * | 6/2000 | Glenn ..................... 134/21 |

(Continued)

*Primary Examiner* — David Redding
(74) *Attorney, Agent, or Firm* — GLOBAL INTELLECTUAL PROPERTY AGENCY, LLC; Daniel Boudwin

(57) ABSTRACT

A compressed air system is provided for automotive or motorcycle use, wherein compressed air is utilized to assist clearing a windshield or a windscreen during foul weather. The system comprises an electrically driven or belt driven air compressor, a compressed air reservoir tank, a network of air lines throughout the vehicle or attached to a rider's helmet, and a plurality of air nozzles that release the air from the air lines on command. The ejected air is highly pressurized and exits at a high velocity to remove water droplets and particles for improved clarity through the windshield or wind screen. A user-operated switch controls at least one valve to release the compressed air from the network of air lines and through the nozzles, wherein the compressed air tank is continually replenished to allow for consistent and repeated bursts of compressed air over an extended period.

4 Claims, 4 Drawing Sheets

(56) References Cited

U.S. PATENT DOCUMENTS 7,040,328 B2 * 5/2006 Woodard .................. B08B 3/02
　　　　　　　　　　　　　　　　　134/102.3
8,322,776 B2 * 12/2012 Fioravanti .............. B60J 1/2005
　　　　　　　　　　　　　　　　　15/250.01

* cited by examiner

COMPRESSED AIR VEHICLE SCREEN CLEARING SYSTEM

CROSS REFERENCE TO RELATED APPLICATION

This application claims the benefit of U.S. Provisional Application No. 61/720,739 filed on Oct. 31, 2012, entitled "The Wipeless Windshield for On and Off-Road Vehicles." The above identified patent application is herein incorporated by reference in its entirety to provide continuity of disclosure.

BACKGROUND OF THE INVENTION

Field of the Invention

The present invention relates to a compressed air system for the windshield of a land vehicle or the helmet of a motorcycle rider that increases the air pressure thereon for forcible removal of water droplets and debris therefrom. The system is contemplated for use with automotive windshields, side windows, and rear windows, while an embodiment further contemplates use with a motorcycle helmet face shield.

Driving in foul weather can be dangerous for motorists in traffic and in dimly lit areas. Water droplets and debris from the road can accumulate on the windshield of the vehicle and obscure the driver's view therethrough. These droplets cause obstructions on the windshield and reduce the ability of the driver to see and anticipate forward events, which causes the driver to slow down or to proceed at great risk.

Traditional techniques for clearing windshields include operable wiper blades that slide along the window glass exterior to physically remove water droplets and debris collected thereon. While effective, wiper blades can quickly become overwhelmed in large downpours, and tend to deteriorate rather rapidly a period of use. This deterioration occurs naturally as the wiper blades become worn, whereby the effectiveness of the wiper for clearing the windshield becomes significantly impaired. If the driver is not diligent with wiper blade replacement, then generally the driver will find himself or herself in the position of driving without full clarify through the windshield during a storm and without recourse to remove the accumulating water droplets. This is quite dangerous for the driver and nearby motorists, and can easily lead to traffic accidents.

In the same manner as it is dangerous for automobile motorists, having reduced clarity while riding a motorcycle in inclement weather is also incredibly dangerous. Most riders wear a protective helmet that affords them both impact protection and eye protection such that the rider can clearly see the road and protect the rider's face from debris in the process. The wind screen is a transparent material that redirects the wind away from the rider's face and prevents flying debris from impacting the rider directly. During rain storms or when the roadway is wet, water droplets and debris can fall onto or be kicked upwards onto the rider's windscreen. The droplets and debris block the rider's view therethrough in a similar fashion as an obstructed windshield of a vehicle; however the rider generally does not have wiper blades to clear the screen and must resort to manually wiping the windscreen with his or her own hands while riding.

Wiping the windscreen of a helmet with one's hand or motorcycle glove is less than effective at clearing the screen. The glove quickly becomes saturated and is rather ineffective over a prolonged rain event. This causes most riders to pull to the side of the road or beneath overpasses to wait out the weather, as vision through the windscreen becomes significantly impaired if the rider continues.

To address these known concerns in the art, the present invention contemplates a compressed air debris removal system for a vehicle windshield or a motorcycle helmet windscreen. The system comprises an air compressor that is driven via electric power or via power from the vehicle engine, whereby a compressed air tank supplies high pressure air to a network of air lines throughout the vehicle. Air nozzles are disposed about the periphery of the vehicle windshield, lights, and other locations of interest to forcibly remove water droplets and debris on the vehicle glass in lieu or in combination with wiper blades. A contemplated embodiment includes a new motorcycle helmet design that incorporates a compressed air line connection along the rear of the helmet, wherein the air line is connected to a compressor and compressed air tank on the motorcycle. Nozzles are disposed along the base of the helmet windscreen to forcibly remove debris therefrom.

Description of the Prior Art

Devices have been disclosed in the art that relate to systems of force air to remove water and debris from vehicle windshields. These include devices that have been patented and published in patent application publications, and generally relate to means of directing and compressing air flow entering the vehicle and directing it onto the vehicle windshield. The following is a list of devices deemed most relevant to the present disclosure, which are herein described for the purposes of highlighting and differentiating the unique aspects of the present invention, and further highlighting the drawbacks existing in the prior art.

One such device in the prior art is U.S. Pat. No. 1,789,016 to Morgan, which discloses a motor car windshield protector that directs a flow of ambient or heated air over the windshield to prevent the deposition of rain or snow thereon. A rotary blower is mounted to the rotational motion of the engine for pressurizing and blowing the air through a discharge member and onto the outer surface of the motor car windshield. The Morgan device utilizes a direct shaft connection with the vehicle engine to power a blower motor, which directs air onto the windshield. While serving a similar purpose, this system introduces considerable drag on the engine and is less efficient than the electrical system of the present invention. The system of the present invention utilizes an electrically driven compressor that is charged by the engine. The compressor compresses air in a reservoir, to be activated by the user.

Another device is U.S. Pat. No. 7,972,203 to Raghuprasad, which discloses an air flow device that transforms incoming air over a vehicle body into lateral air flow across a windshield for the purpose of clearing the same. The device comprises a module having a fan rotatable about a fan axis. Air flowing over the vehicle enters the module and the spinning fan blades direct the inflowing air through an outlet in the module such that it exits with a higher pressure for material removal from the windshield. The Raghuprasad device is a fan driven by an electric motor, wherein the module is a discrete unit placed along the sides of a vehicle windshield. The present invention, by contrast, provides a vehicle air compressor that includes air lines extending therefrom and terminating at a plurality of air nozzles. The compressed air is released through the nozzles on demand by the driver to clear the windshield or the wind screen of the motorcycle helmet, as dictated by the given embodiment of the system.

U.S. Pat. No. 3,972,494 to Drews discloses an air jet forming means for a land or air vehicle that directs flow air over the windshield of the vehicle. An air pump is located behind the radiator of a land vehicle, along with an air jet forming unit that comprises an inlet and an outlet. Incoming air is pressurized and directed out of the outlet in a semi-circular pattern to direct water droplets from remaining on the vehicle windshield. Similar to the other devices of the art, the Drews device fails to contemplate a compressed air tank and individual nozzles that are operably controlled by the user. The Drews device operates based on air moving through the vehicle grille and is dependent on vehicle speed. The present invention can operate when the vehicle is stationary.

U.S. Pat. No. 5,097,563 to Cowan discloses a vehicle window cleaning device that replaces traditional wipers, wherein an electrically powered blower and heater are provided. The blower draws in air and compresses the same, directing the pressurized air through conduits and from air nozzles disposed around the window glass exterior. The high speed blower produces a high speed flow of air that is drawn from the environment, while the heater heats the air prior to exiting the nozzles. The blower is a fan-driven assembly that accelerates the air through the ducting of the assembly, while the heater assembly draws air from the vehicle engine exhaust manifold. Similar to the Drews device, the Cowan device provides a blower system rather than a compressed air tank and a series of switches that release the compressed air from nozzles disposed about the windshield of the vehicle. Although the Cowan device is capable of operating while the vehicle is stationary, its means of pressurizing the air is significantly different than that contemplated by the present invention.

Finally, U.S. Pat. No. 2,367,426 to Patterson discloses a windshield protector and cleaner for an airplane window, wherein compressed air is forced through a rotating head having nozzles thereon. The air is projected onto the windshield to remove snow and water therefrom. Similar to the aforementioned devices, the Patterson device fails to anticipate the air compressor-driven windshield or helmet windscreen clearing system of the present invention.

The prior art devices relate to air pumps and air flow directing apparatuses that are utilized to force air against a vehicle windshield for the purposes of removing rain droplets and built-up debris. These devices fail to anticipate a powered air compressor, being a piston or rotary compressor and powered by electric or pulley driven power, whereby a tank of compressed air is maintained on the vehicle for use in ejecting pressurized air over the vehicle windshield on demand by a user. The devices of the prior art also fail to disclose such a use in conjunction with a motorcycle helmet, wherein a rider is assisted in clearing the exterior surface of his or her windscreen while riding in foul weather.

It is submitted that the present invention is substantially divergent in design elements from the prior art, and consequently it is clear that there is a need in the art for an improvement to existing compressed air vehicle screen clearing systems. In this regard the instant invention substantially fulfills these needs.

SUMMARY OF THE INVENTION

In view of the foregoing disadvantages inherent in the known types of vehicle screen clearing systems now present in the prior art, the present invention provides a new system for an automobile or a motorcycle, wherein the same can be utilized for increasing the surface pressure on automotive glass or a helmet windscreen to remove water droplets and debris therefrom.

It is therefore an object of the present invention to provide a new and improved vehicle screen clearing system that has all of the advantages of the prior art and none of the disadvantages.

It is another object of the present invention is to provide a vehicle screen clearing system that utilizes a compressed air tank and a system that continually replenishes the same for maintaining a reservoir of compressed air for use in forcibly clearing the exterior surface of automotive glass or a helmet windscreen.

Yet another object of the present invention is to provide a vehicle screen clearing system that utilizes a piston or rotary air compressor that is attached to the vehicle, wherein power is provided thereto via electrical power or via belt power from the engine thereof.

Another object of the present invention is to provide a vehicle screen clearing system that routes a network of air lines through a vehicle for the placement of nozzles around the perimeter of the automotive glass and for the operative location of valves that allow for independent control over the operation of specific nozzle sets based on the set positioning around a vehicle.

Another object of the present invention is to provide a vehicle screen clearing system that is contemplated for use in motorcycle applications, wherein a full-face motorcycle includes a network of air lines and nozzles disposed at the base of the windscreen, while a connection to an air line extending from the motorcycle is provided.

Another object of the present invention is to provide a vehicle screen clearing system that is ideally suited for use in automotive or similar land vehicle use, wherein the system may assist existing wiper blades or act as a complete replacement thereof.

Another object of the present invention is to provide a vehicle screen clearing system that is provided as an option in vehicle models by automotive manufacturer, or as an aftermarket accessory for existing vehicles, wherein aftermarket installation is required.

A final object of the present invention is to provide a vehicle screen clearing system that utilizes compressed air that is of sufficient pressure to forcibly remove water droplets and light debris from a windshield or windscreen without requiring excessive vehicle power to drive the system compressor.

Other objects, features and advantages of the present invention will become apparent from the following detailed description taken in conjunction with the accompanying drawings.

BRIEF DESCRIPTIONS OF THE DRAWINGS

Although the characteristic features of this invention will be particularly pointed out in the claims, the invention itself and manner in which it may be made and used may be better understood after a review of the following description, taken in connection with the accompanying drawings wherein like numeral annotations are provided throughout.

DETAILED DESCRIPTION OF THE INVENTION

Figure 1:
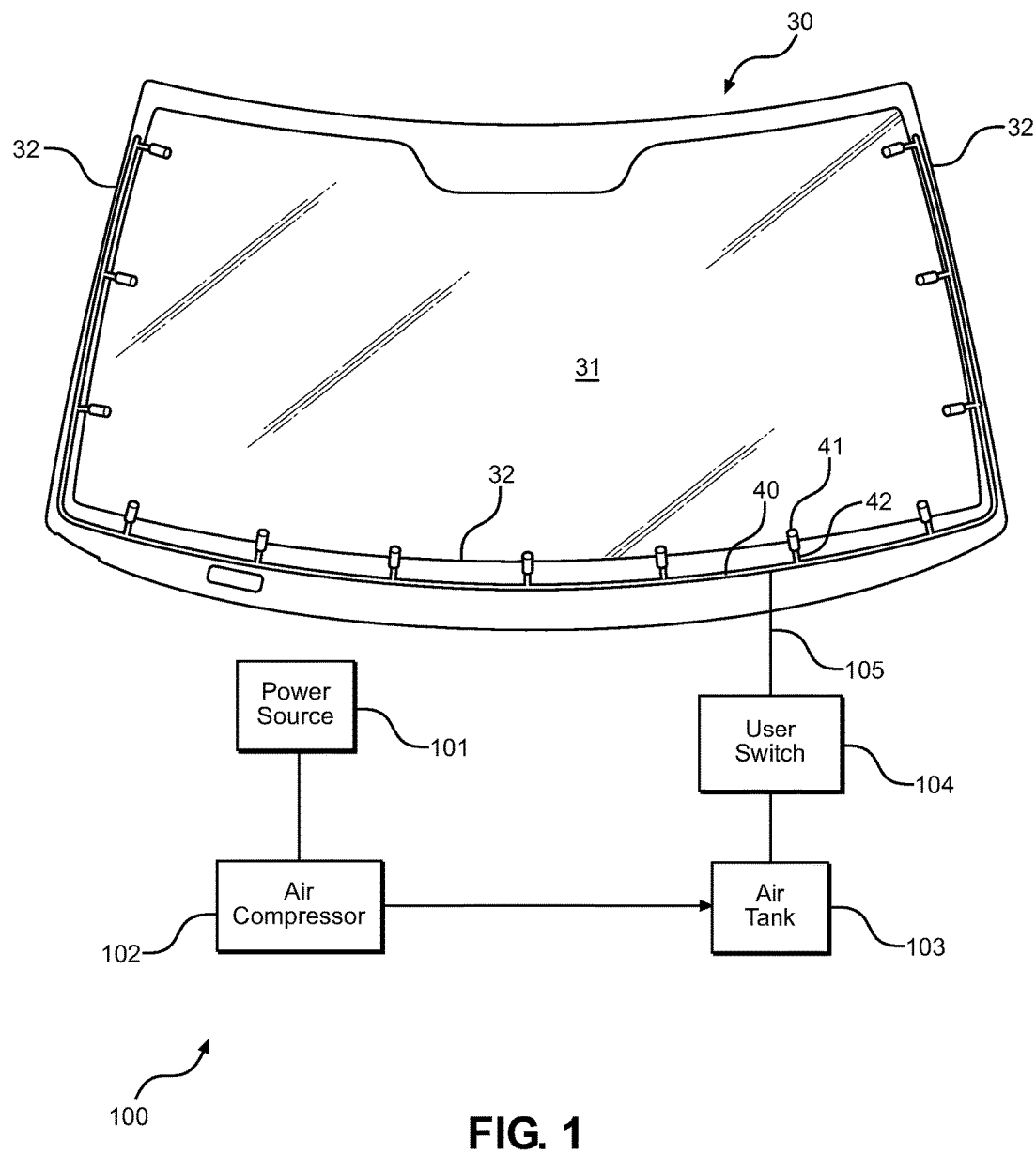
FIG. 1 shows a system view of the present invention in conjunction with automotive glass.

Reference is made herein to the attached drawings. Like reference numerals are used throughout the drawings to depict like or similar elements of the vehicle screen clearing system. For the purposes of presenting a brief and clear description of the present invention, the preferred embodiment will be discussed as used for increasing the air pressure over automotive glass and motorcycle helmet windscreens for operably and forcibly removing water droplets and debris therefrom without resorting to physical removal tools. The figures are intended for representative purposes only and should not be considered to be limiting in any respect.

Referring now to FIG. 1, there is shown the present system deployed on vehicle glass 30, notably the windshield of an automobile. Also illustrated are the system elements of the present invention. The system provides an alternative or replacement means of clearing the glass surface 31 of a vehicle using high compressed air and nozzles 41 disposed about the periphery 32 of the glass 31. The nozzles 41 discharge the compressed air over the glass surface 31 to increase the pressure thereon. The combination of air pressure as the vehicle is in motion, together with the significant boost in pressure provided by the compressed air system removes any lingering water droplets or loose debris (leaves, dirt, etc.) stuck on the glass 31. The system is contemplated as one that is fully functional when the vehicle is in motion or when stationary (i.e. no pressure from the air movement over the body of the vehicle while in motion).

The elements of the system 100 include a power source 101, which includes the vehicle engine, electric motor, or an auxiliary electrical source (e.g. a battery) that powers an air compressor 102. The air compressor 102 is a piston type or rotary type air compressor that draws in ambient air and compresses it to a higher pressure above atmospheric for storage in a compressed air storage tank 103 disposed within the vehicle. The modular power source 101 allows the system to be deployed on traditional, combustion engine vehicles, as well as electric vehicles. In a combustion engine vehicle, the power is created either using a belt and pulley, wherein rotation energy is drawn from the engine, or alternatively the vehicle's electrical system (powered by the engine) is utilized to power an electric air compressor. The requirements of the air compressor 102 and the capabilities of the vehicle will dictate the design of the system and the type of compressor deployed. Similarly, the type of compressor will depend on available power and the requirements of the system to replenish the compressed air tank as the system is utilized to clear debris from the vehicle glass. The greater the network of nozzles 41 disposed about the vehicle, the greater demand for compressed air will be, and therefore the greater the demand on the compressor 102. This demand will drive the size and capacity of both the compressor 102 and the compressed air tank 103.

Moving away from the system elements 100 generating the compressed air, the vehicle includes a network of air lines 105 that carry the compressed air from the air tank 103 to the nozzles 41 disposed along the periphery 32 of each vehicle glass 30 being treated around the vehicle. It is contemplated that the system may be design specifically for the windshield, or alternatively may be deployed along the side windows, rear window, the headlights, the mirrors, and any other areas wherein visibility is necessary in wet weather.

As shown in FIG. 1, a windshield application is shown. The periphery 32 of the windshield includes branches 40 of the air line 105 network, which lead to even smaller branches 42 leading to each nozzle 41. The air line 105 communicates the compressed air from the air tank 103 to each of the branches and through each nozzle on command from the user, wherein the compressed air exits the nozzles 41 along the exterior of the glass surface 31 to forcibly remove debris and water therefrom. The air line branches are disposed along the exterior perimeter 32 of the glass, and may be imbedded in the windshield surround structure thereof.

To operate the system and to release the compressed air from the tank 103, at least one user switch 104 is disposed within the vehicle interior for the user to operably engage the system as necessary. If the system spans the entire vehicle, more than one switch 104 may be presented to the driver for individual control of the system for different parts of the vehicle. This is similar to individual use of front and rear wiper blades in conventional vehicles. The switch 104, or switches, may be configured to allow the user to control the duration of the compressed air release from nozzles 41, or alternatively there may be a set limit provided such that the air tank is not fully drained of compressed air. Alternatively, the air compressor may be designed such that it can overcome or at least match the release rate of all of the nozzles 41 around the vehicle such that continual and prolonged dispensing of the compressed air by the driver is accounted for. Finally, depending on the design, the switch may simply operate based on a single depression thereof, wherein a metered amount of compressed air is released for each depression of the switch 104.

Figure 2:
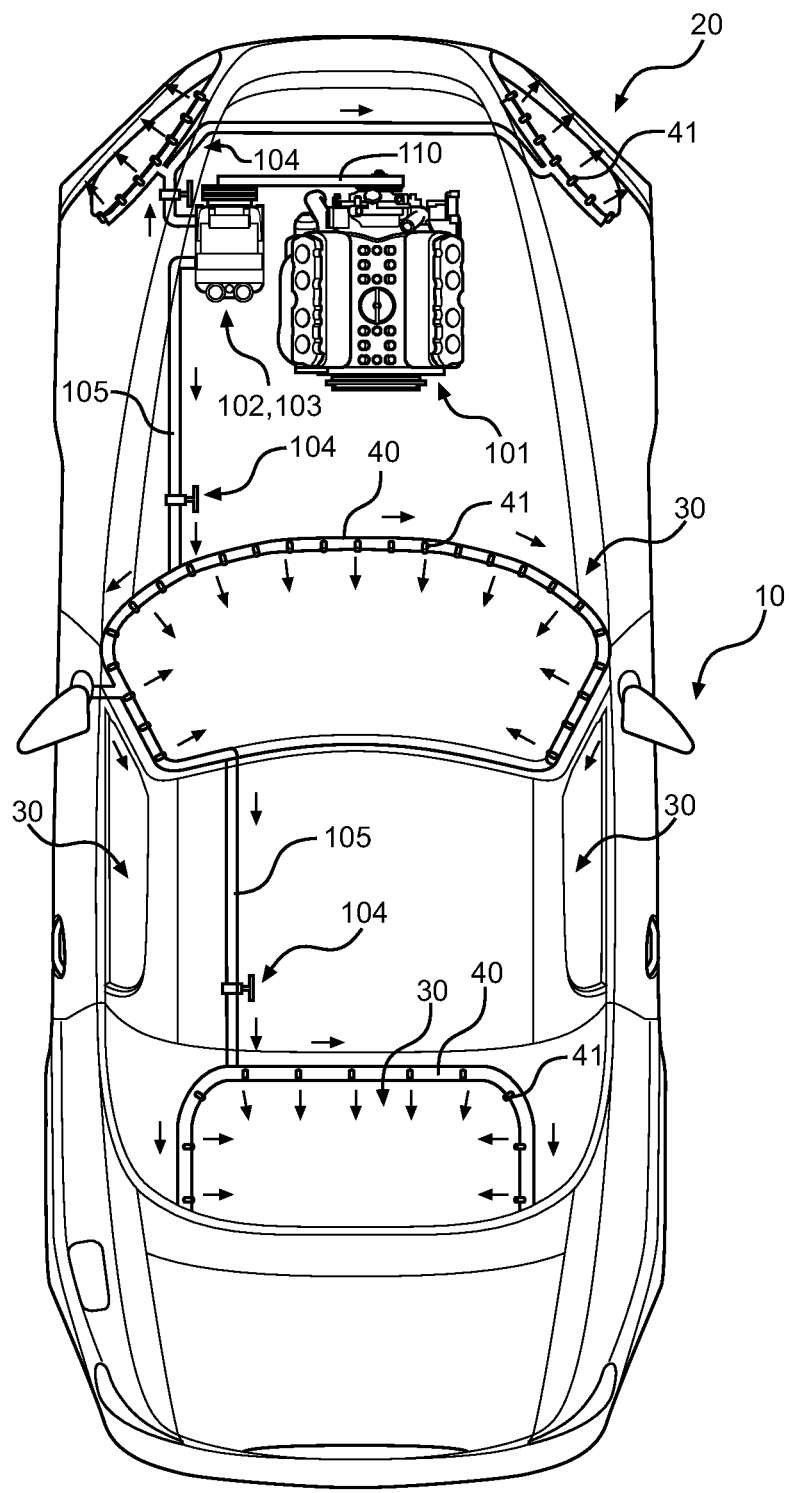
FIG. 2 shows an overhead view of the system deployed on a vehicle and disposed about the various vehicle window glass locations.

Referring now to FIG. 2, there is shown an overhead view of the system deployed throughout a motor vehicle for clearing the same of droplets and debris along different surfaces thereof. In the embodiment as illustrated, an air compressor 102 is provided within the engine bay of the vehicle, wherein power is delivered thereto via a belt 110 drawing power from the vehicle engine 101. The air compressor connects to an air tank therebelow, which is connected to at least one air line 105 for communicating the compressed air therefrom.

As illustrated, the headlights 20 include a branch of the air line for releasing compressed air thereover, wherein a plurality of nozzles 41 remove water and debris on the exterior lens of the headlight 20. Extending rearward from the air tank is a branch 40 disposed about the perimeter of the vehicle front and rear window glass 30. Nozzles 41 are disposed the periphery of each the wind shield and the rear window for forcible remove of standing water and debris from their respective surfaces. Finally, the side windows 30 and the mirrors may also have their own branch in the air line (not shown).

Specific branches of the air line 105 may include individually controlled valves 104 that release the compressed air from the air tank in the engine bay. For instance, the windshield, headlights, and mirrors may operate using a single switch, wherein their respective valves 104 are operated in unison upon command. The rear glass and the side glass nozzles may further be operated independently. Overall, the given layout and the chosen system design may take on several forms, depending on the vehicle type, user expectations, and costs associated with the system. It is contemplated that the system may be integrally designed with the vehicle, or alternatively provided as an aftermarket accessory.

Figure 3:
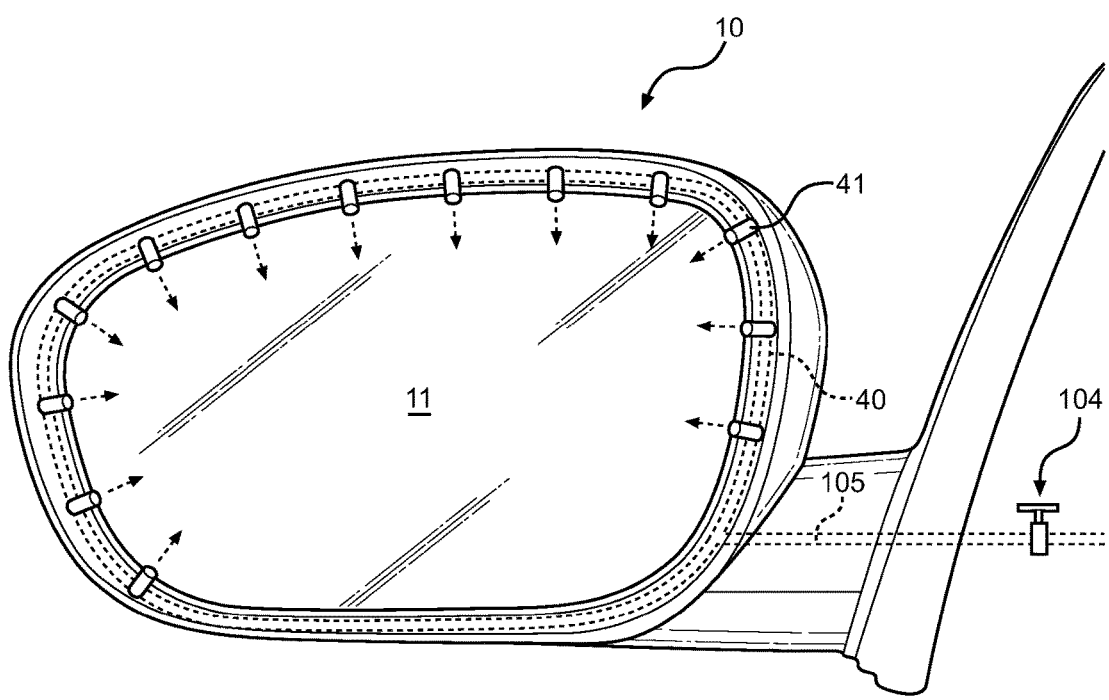
FIG. 3 shows view of the system deployed on a vehicle side mirror for clearing the same.

Referring now to FIG. 3, there is shown an embodiment of the present system and a branch thereof that contemplates placement of nozzles 41 around the side mirror 10 surround. This embodiment releases compressed air from the air line 105 into the branch 40 in the mirror surround such that the compressed air is released from the nozzles 41 and onto the mirror surface 11. As with the rest of the system, a valve 104 controls the release of air into the branch 40.

Figure 4:
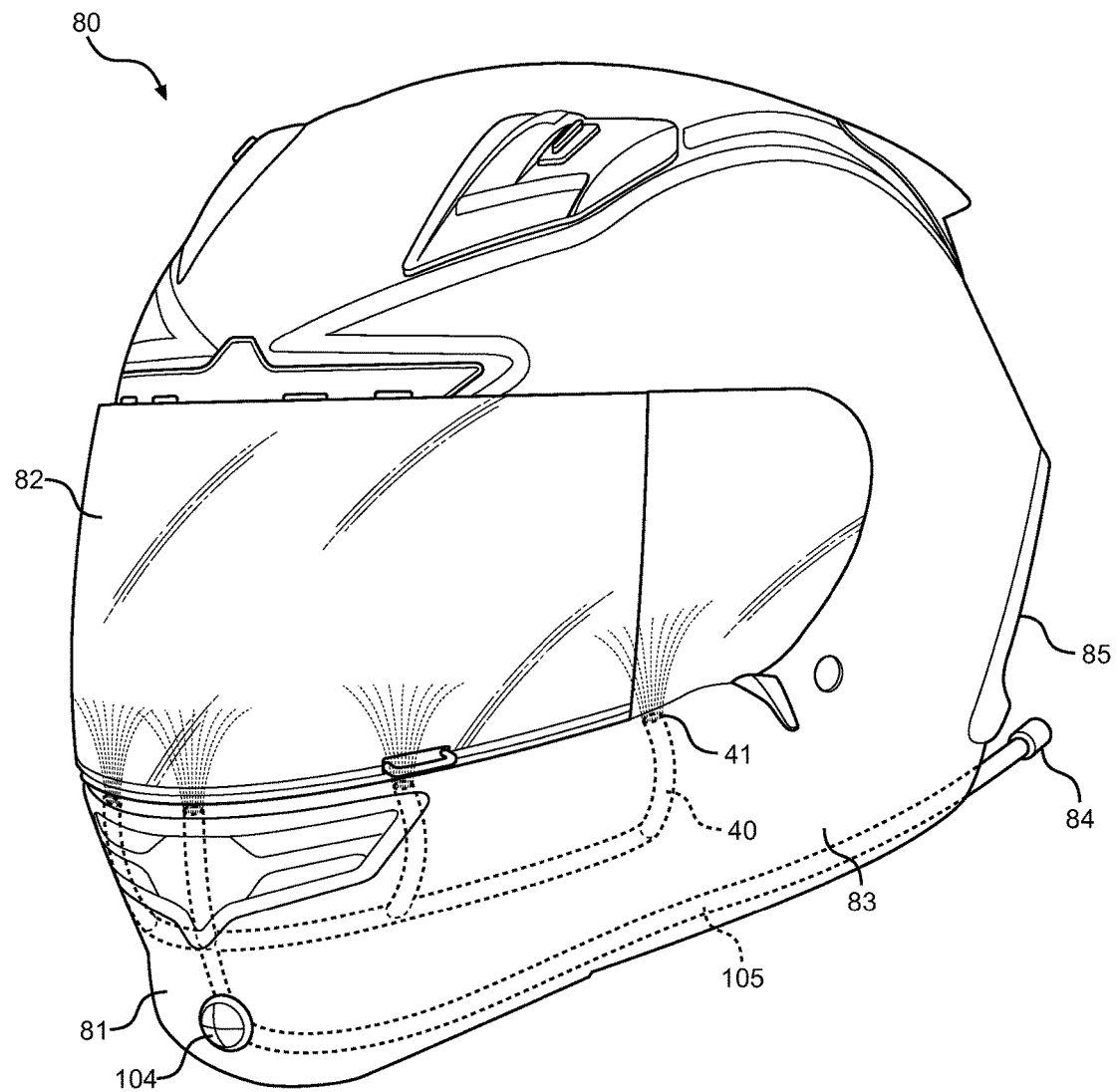
FIG. 4 shows the motorcycle helmet embodiment of the present invention, wherein the windscreen thereof is cleared using the compressed air system.

Referring now to FIG. 4, there is shown an application of the present system in a motorcycle helmet 80, wherein the system operates in the same manner as the motor vehicle system, however a branch 40 of the air line 105 is disposed within the interior of the motorcycle helmet 80. This embodiment allows a rider to clear the windscreen 82 of the helmet 80 while riding in rain without having to physically wipe the same, which creates smears and is largely ineffective in practice. The air line 105 is disposed within the lower side portion 83 of the rider helmet and includes a rear-facing quick attach valve 84 that allows the rider to connected the air line from the motorcycle to the rider helmet. The same system as shown in FIG. 1 is utilized; however the system is disposed within the motorcycle and draws power therefrom. An air line is extended from the motorcycle to the helmet valve 84 for controlled release of compressed through nozzles 41 disposed along the lower portion of the windscreen.

The air line extends through the helmet and terminates in at least one nozzle 41 below the windscreen 82 and along the exterior of the helmet. Alternatively a plurality of nozzles (as shown) is deployed using a plurality of individual branches 40 in the air line 105. An external release button operates a valve 104 in the helmet to release the compressed air from the air tank on the motorcycle ad through the nozzles 41. This releases the compressed air across the surface of the windscreen to clear the same of dirt, snow, and debris while riding. To facilitate this operation, it is preferred that the valve control button be disposed along the leading portion 81 of the helmet for ease of access, while the valve 84 that connects to the system is preferably along the backside 85 of the helmet.

The motorcycle helmet embodiment offers a means of ejecting pressurized air at the windscreen 82 of the helmet, which blasts away water and debris such that the rider can maintain clear vision through the visor. This is critically important if riding in foul weather, which is common on adventure motorcycles or during long trips wherein riders are forced to continue through rain or snow. The ability to clear away any blockages keeps the rider safe and allows the screen 82 to be streak free thereafter.

It is submitted that it can be highly dangerous to drive or ride in rain or snow with a wet windshield, cloudy mirrors, foggy windows, or a blocked windscreen. Traditional windshield wipers may be able to keep the front windshield clean for a period of time and under light rain conditions, but they do not address the rest of the vehicle and they are not suited for continual use without frequent blade replacement. For motorcyclists, clearing a windscreen by hand results in streaking, fogginess, and wet hands after cleaning. The technique of clearing by hand is not highly effective, and therefore requires a more robust approach. The present invention is submitted as system for both automotive and motorcycle use, whereby water, snow, slush, and debris can easily be removed using compressed air, wherein the system replaces wiper blades or is provided as an assistant thereto.

The system is one that a vehicle or helmet manufacture may include in their product, or is one that can be provided to the public as an aftermarket accessory for existing vehicles.

The present invention utilizes compressed air to maintain clarity of a vehicle's windshield, headlights, side-view mirrors, side windows, and/or rear window by clearing away water droplets and other debris while raining or snowing. The system can replace or supplement the use of windshield wipers while eliminating the dangers associated with overwhelmed windshield wipers. The present invention reduces the amount of wiper blade wear item, and can be applied to cars, trucks, buses, tractor-trailers, RVs, garden tractors, trains, airplanes and even motorcycles screens or motorcycle helmets.

Overall, it is therefore submitted that the instant invention has been shown and described in what is considered to be the most practical and preferred embodiments. It is recognized, however, that departures may be made within the scope of the invention and that obvious modifications will occur to a person skilled in the art. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A compressed air system for cleaning a vehicle screen, consisting of:
　　an air compressor adapted to draw in and compress ambient air into compressed air;
　　a power source powering said air compressor;
　　a compressed air tank receiving said compressed air from said air compressor;
　　at least one air line from said compressed air tank;
　　said air compressor, power source, and compressed air tank being disposed within a vehicle;
　　at least one valve along said air line for controllable releasing said compressed air from said air compressor;
　　at least one user switch for opening said at least one valve;
　　a branch extending from said air line and positioned along a periphery of a surface to be cleaned, said branch having a lower horizontal member having a pair of opposing ends, and a pair of vertical members, wherein each vertical member extends from one of the pair of opposing ends of the horizontal member, each vertical member comprising a terminal end;
　　a gap disposed between said terminal ends of said pair of vertical members, wherein said gap is configured to provide a pathway to remove one or more particle from said surface;
　　a plurality of nozzles disposed on each of said horizontal member and said pair of vertical members of said branch for releasing said compressed air onto said surface, said plurality of nozzles configured to forcibly remove water and debris from a vehicle surface;
　　wherein each of the plurality of nozzles is perpendicular to a portion of the branch on which it is disposed.

2. The system of claim 1, wherein said power source comprises a belt connected to an internal combustion engine.

3. The system of claim 1, wherein said power source comprises a vehicle electrical system and said air compressor comprises an electric air compressor.

4. The system of claim 1, wherein the lower horizontal member and the pair of vertical members extend along a periphery of the vehicle screen.

* * * * *